United States Patent [19]
Park et al.

[11] 4,104,418
[45] Aug. 1, 1978

[54] GLASS LAYER FABRICATION

[75] Inventors: Kyu C. Park, Yorktown Heights, N.Y.; Elizabeth J. Weitzman, Boulder, Colo.

[73] Assignee: International Business Machines Corporation, Armonk, N.Y.

[21] Appl. No.: 703,382

[22] Filed: Jul. 7, 1976

Related U.S. Application Data

[63] Continuation-in-part of Ser. No. 615,967, Sep. 23, 1975, abandoned, which is a continuation of Ser. No. 462,289, Apr. 19, 1974, abandoned.

[51] Int. Cl.² ............................................. B05D 3/06
[52] U.S. Cl. ..................................... 427/42; 313/220; 313/221; 427/78; 427/248 R
[58] Field of Search ........................... 427/42, 248, 78; 313/220, 221

[56] References Cited

U.S. PATENT DOCUMENTS

| | | | |
|---|---|---|---|
| 3,450,824 | 6/1969 | Hanks et al. | 427/42 |
| 3,499,167 | 3/1970 | Baker et al. | 313/188 |
| 3,801,356 | 4/1974 | Mulfinger et al. | 427/248 |
| 3,836,393 | 9/1974 | Ernsthausen et al. | 427/42 |

*Primary Examiner*—John H. Newsome
*Attorney, Agent, or Firm*—George Baron; John A. Jordan; Bernard N. Wiener

[57] ABSTRACT

The construction of the dielectric layer of a panel used in making a gas panel display by an E-gun evaporation process in the same evacuated chamber that deposits an electron-emissive layer on the panel so as to obtain increased efficiency in the fabrication and improved operating characteristics of the gas panel. Stress free dielectric layers are obtained by E-gun evaporating borosilicate glass from a molten pool of borosilicate having an area of at least 2cm² up to about 10cm² with the substrate for the layers being maintained at from 200° C to 300° C and the evaporation rate being 40 to 80 Å/sec. at approximately 10 inches from the molten pool.

9 Claims, 3 Drawing Figures

GLASS LAYER FABRICATION

BACKGROUND OF THE INVENTION

This application is a continuation-in-part of application Ser. No. 615,967 filed Sept. 23, 1975 which is a continuation of application Ser. No. 462,289 filed Apr. 19, 1974, each of which applications is now abandoned.

In the making of a gas panel, parallel metal electrodes are deposited onto a glass surface. On top of such electrodes is sprayed a layer of insulating glass which is bonded to the metal-supporting glass surface by heating the substrate through a lengthy, high temperature reflow cycle. The gas display panel is formed by sealing two identical glass plates, with their respective electrodes orthogonal to one another, leaving a space between the plates for housing a gas that is capable of emitting light in response to an electric voltage applied simultaneously to such orthogonally disposed electrodes. The glass that is sprayed onto the electrodes may have incorporated therein a material that emits electrons, or an electron-emissive layer may be deposited over such glass to supply electrons to the gas in the panel. Such electron emission is necessary in the low voltage operation of the completed gas panel.

In prior art gas panel construction, a popular and acceptable way of depositing the insulating glass layer over the metallurgy for bonding to the metal-supporting surface of a gas panel was to spray it in the form of glass "slurry" and then thermally control the cooling of the glass in an oven. The bonding of the glass layer onto the glass substrate that supports the metallurgy takes place through a time-consuming high temperature reflow cycle. After the latter time-consuming operation is terminated and the gas panel has been cooled, an overcoat layer, i.e., MgO, having a high secondary emission, is evaporated onto the bonded glass layer by inserting the panel into a vacuum chamber for the evaporation.

It has been observed that the "wet" reflow cycle requires a thermal processing in an oven, and such processing tends to attack the very thin and fragile metallurgy underneath the glass being thermally processed.

In the present invention, the low dielectric constant of E-gun deposited borosilicate glass allows application of a relatively thin layer (6.5$\mu$) of borosilicate glass, thus reducing the difficulties encountered in maintaining uniformity in the gas spacing, as experienced with the uneven distribution of thick flow-on dielectrics for a panel made of soda lime glass plates. Additionally, the E-gun deposition of a suitably thin layer of glass can be accomplished in about one-half to one hour, rather than days. Moreover, the E-gun evaporation procedure for making a gas panel provides a more flexible glass overcoat than is attainable by the use of a "wet" or slurry glass reflow cycle in that the composition of the glass can be altered by controlling the deposition rate, the oxygen partial pressure during evaporation as well as the composition of starting material.

E-gun evaporation of borosilicate glass layers is, in general, known in the art as may be seen, for example, by reference to U.S. Pat. No. 3,801,356 to Mulfinger et al. In such prior art attempts to E-gun evaporate borosilicate glass, the evaporators employed small sources of glass, generally having heated surface areas less than 1cm$^2$. Consequently the glass fractionated, i.e., the glass evaporated off nonuniformly with the more volatile components being emitted first from the source, resulting in a pitted non-uniform film that readily peels off the substrate. In contrast to this approach, it has been found, in accordance with the principles of the present invention, that undesirable fractionation is avoided using sources between approximately 2 and 10 cm$^2$.

In further contrast to the prior art, it has also been found that unless the substrate onto which the film of glass is being deposited is maintained at least at about 200° C, stress is also high. In this regard, glass films typically prepared in the manner of Mulfinger et al, for example, cannot withstand thermal cycling because of stress. For example, in gas panel sealing, the panel is typically cycled at 500° C. Glass films prepared by methods, such as that of Mulfinger et al, will generally flake off of the substrate because they are highly stressed. In contrast, in glass layers prepared in the manner of the present invention, the initially low stress films become essentially stress-free, and adhere firmly to the substrate.

What has been found, in accordance with the present invention, is that particular parameters necessary to the evaporation of uniform and relatively stress-free borosilicate glass films must be critically controlled. For example, it has been found that if the evaporant source has a heated surface area less than 2cm$^2$, fractionation will occur. Similarly, the substrate upon which the glass is to be deposited must be maintained within a temperature range of from 200° C to 300° C. Moreover, in order to obtain a long-lived, stress-free, dielectrically strong layer for use in a gas discharge display panel in accordance with the present invention, it is further necessary that the glass be evaporated at a deposition rate of about 40 to 80 Å/sec. as measured at approximately 10 inches from the source. Otherwise the deposited film will be highly stressed.

SUMMARY OF THE INVENTION

In general, the E-gun deposition process for glass layers, in accordance with the present invention, starts with the producton of approximately a 2 to 10 cm$^2$ pool of borosilicate glass source material, preferably using electron guns with an electron beam deflection of 90° to 270°. Initially the power supplied to the evaporation source material is increased gradually to the point beyond that of final evaporation level and then reduced to a steady evaporation level. A shutter placed below the substrate holder is opened after this steady state is established, avoiding any bubbling or spitting during the actual deposition onto the substrates. The substrates are held at an elevated temperature and oxygen gas is bled, if necessary, into the evaporation chamber in that increasing the oxygen partial pressure during the deposition has the effect of improving the stoichiometry and lowering the silicon content of the evaporated borosilicate films.

Consequently, it is an object of the present invention to improve upon the preparation of dielectric layers by employing an E-gun deposition process.

It is yet another object of the present invention to apply the E-gun deposition process to specifically produce dielectric glass films which are inexpensive, clean, dry, optically smooth, low light scattering, of high transmittance as per application to the gas display panel.

A further object of the present invention is to make such glass films that are exceedingly stress-free and stable, can be sufficiently thick to have proper capacitance and breakdown strength, and are capable of manufacture in a relatively short time period.

These and other objects, features and advantages are obtained by E-gun evaporating borosilicate glasses with a scanning electron gun in accordance with the arrangement and conditions described herein. In accordance with the present invention, the following parameters are both essential and critical to obtaining the desired product of the invention. The glass is evaporated from a molten pool of borosilicate of from at least 2cm$^2$ up to about 10cm$^2$, the substrate upon which the glass is deposited is maintained between 200° C and 300° C and the evaporation rate ranges from 40 to 80 Å/sec. at approximately 10 inches from the source. With the above parameters relatively stress-free films of 50 microns or more can readily be evaporated.

DESCRIPTION OF THE DRAWINGS

As seen in FIG. 1, a typical gas panel display unit 2 comprises a single panel or plate consisting of a glass substrate 4 having parallel lines of metal 6 either on or imbedded in said substrate 4. A dielectric material 8, wherein borosilicate glass is an acceptable and preferred material, is deposited by the E-gun deposition technique to be described hereinafter. A second panel, identical to the first panel, comprises a glass substrate 4', into which are imbedded (assuming the first panel's substrate 4 has imbedded metallurgy 6) parallelly disposed metal lines 6' with an E-gun deposited layer 8' of borosilicate glass. One panel is placed on the top of the other panel so that all the parallel metal lines 6 of one panel are orthogonal to all the metal lines 6' of the second panel. As is familiar to those skilled in the art, the two panels may be secured in position with a rectangular frame 10 of a solid tubular-shaped sealing glass rod placed between the panels, and weights (not shown) may be placed on the top panel to enhance the fusing of the two panels together when the sealing glass is heated. A shim (not shown) typically is placed between the glass panels to set minimum separation of the panels as heat is uniformly applied to both panels during the fusing step, so as to achieve a separation between panels of 2-4 mils. A hole 14 is drilled only through one of the two glass panels and a tube 16 is glass soldered to that opening so that after the 2-4 mil spacing has been evacuated, a mixture of neon and 1/10% of argon or other suitable gas mixture is inserted through the tube to a pressure of 350-500 torr. The hole 14 is sealed off after the ionizable gas has been inserted by tipping off the tube 16 and suitable current-carrying leads 20 are connected to each metal line 6 and 6', respectively, of both glass panels so that appropriate actuating signals can be sent through them for exciting or de-exciting the gas discharge panel. No lead is shown for metal line 6 in that the end of such line is not shown in FIG. 1.

Figure 1:
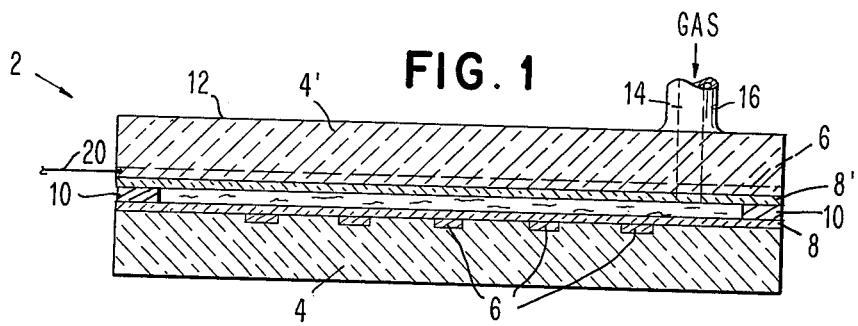
FIG. 1 is a schematic diagram of the gas panel whose dielectric layers are manufactured in accordance with the teachings of the present invention.
Figure 1A:
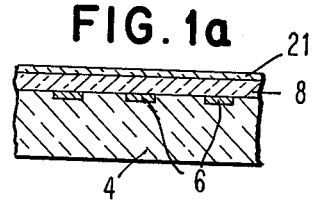
FIG. 1a is a modification of the structure of FIG. 1.

In the operation of the completed gas panel display unit of FIG. 1, it is required that the dielectric 8 be electron emissive. This can be accomplished by incorporating electron emissive material within the borosilicate glass 8 or by depositing an electron emissive layer 21 (See FIG. 1a) over layer 8. A suitable electron emissive layer is MgO.

Figure 2:
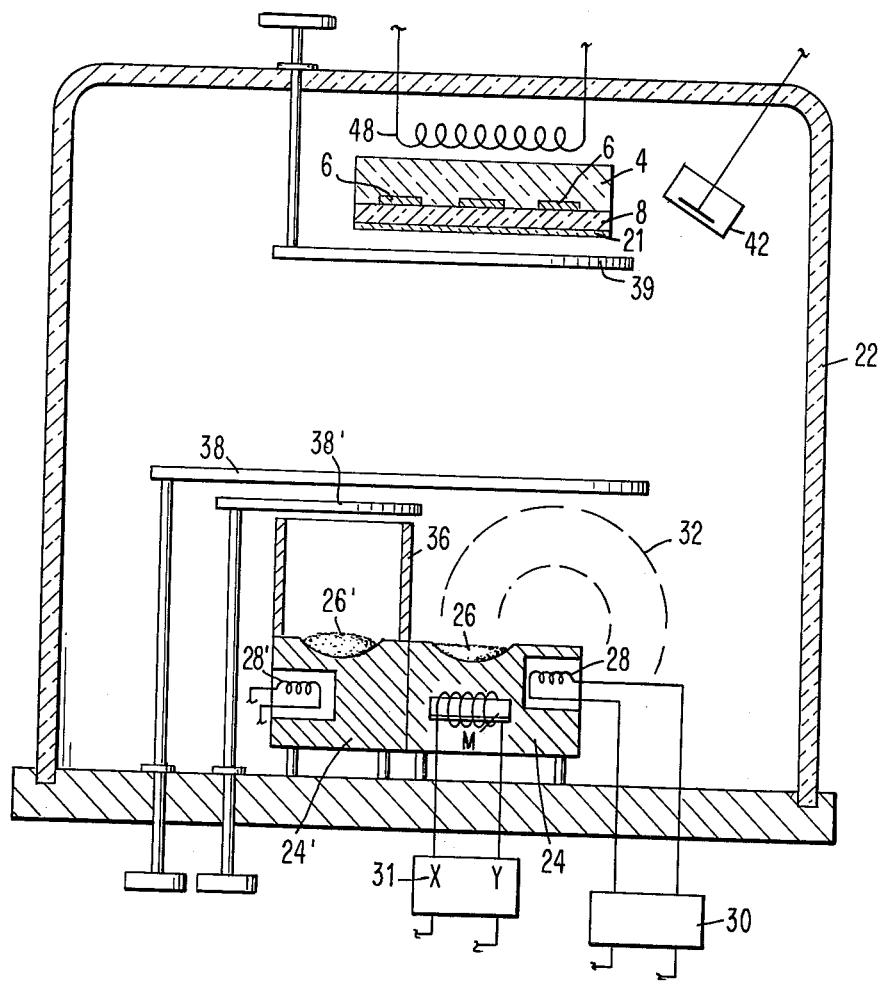
FIG. 2 is a schematic showing of an evacuated chamber employing an evaporation system for depositing a glass dielectric over the substrates to be sealed together in making up the desired composite gas panel display.

The system for depositing the borosilicate glass layer 8 and the MgO layer 21, if desired, is shown schematically in FIG. 2. The system consists of an evacuated chamber 22 in which depositions of the glass layer 8 and the MgO layer 21 take place in two sequential evaporations from a single pumpdown. Within the chamber 22 is a copper boat 24 into which is placed a bulk borosilicate glass source 26. A tungsten filament 28, within the boat housing, is connected to a source 30 of electrical energy for heating said filament 28. The electrons 32 emitted from filament 28 are attracted by a magnet M (shown in dotted line) within the boat 24 (but not shown for clarity in boat 24') onto the source material 26, heating the latter. An x-y sweep control unit 31 provides for longitudinal beam positioning and for automatic control of both longitudinal and lateral electron beam sweeping so as to uniformly heat and melt a large surface area of the source material 26. Shutters 38 and 39 are interposable between the source material 26 and a substrate 4 with its metallurgy 6 which are to be coated with the vaporized material emanating from source 26. An additional boat 24', identical to the other boat 24 and offset from it, is placed on the opposite side of a shield 36, the latter separating both boats 24 and 24' and also helping to prevent cross contamination. Chunks of MgO single crystal source 26' are placed into the boat 24', and the deposition of the MgO layer 21 over the glass layer 8 is carried out by opening shutters 38' and 39 during the evaporation of desired amount of MgO. Shutter 38' is in another plane than that of shutter 38 so that the source 26' which is MgO is bombarded with electrons from its electron filament source 28'. For the sake of clarity, electrical power for heating the filament 28' or deflecting its emitted electrons onto MgO source 26' are not shown. During separate depositions of the substances from sources 26 and 26', respectively, the thicknesses of the deposited layers 8 and 21 are monitored by a detector 42. A heater 48 maintains substrate 4, held at 10 inches away from the evaporation source, at desired elevated temperatures during the deposition of glass layer 8 and electron emissive layer 21.

In a representative deposition run, a borosilicate glass source 26 was heated by electron beam bombardment in an evacuated chamber maintained at $10^{-6}$ torr so that a molten pool of borosilicate, having an area of 2 to 10 cm$^2$, was created. The power supplied to evaporate the borosilicate glass source material was increased gradually, heating uniformly the pre-set area to a level slightly higher than the eventual power level need for the establishment of a desired steady evaporation rate. It was found desirable, during the initial heating period, not to exceed the power level needed for the final steady evaporation rate. An excess of 20% or less of that power level is tolerable. The establishment of a large uniformly heated molten pool was found to be very important to avoid undesirable fractionation. Uniform heating over a large area was accomplished by a careful control of both longitudinal and lateral electron beam sweep control, aided by the use of pole extensions and shunt bars, and a simultaneous control of heating rate. The substrate 4 was maintained at 200° C during evaporation of the borosilicate glass and the shutter 38 was interposed between source 26 and substrate 4 until the source 26 was evaporating at a steady rate, at which point the shutter was taken out of the path of the evaporating source 26. It was found that a 6.5 to 7.0 micron thick layer 8 of borosilicate glass could be deposited in 20 minutes. The deposited layer 8 was transparent and smooth.

A series of runs were made on various glass substrates wherein the glass used had a thermal expansion coefficient range of 25–100 × 10$^{-7}$ inches per inch per degree centigrade and the composition of the deposited borosilicate film 8 that are stable varied as follows: $SiO_2$ (82–89 weight %); $B_2O_3$ (8–15 weight %); $Na_2O$ (1.7–2.4 weight %) and all films had a trace of $Al_2O_3$. The following Table I lists the components of deposited films 8 having different evaporation rates in Å/sec. The percentage of $Al_2O_3$ in all evaporated film layers was found to be less than 0.09%.

TABLE I

| Sample | Evaporation Rate (Å/sec.) | $SiO_2$ (wt.%) | $Na_2O$ (wt.%) |
|---|---|---|---|
| A | 81 | 85.8±2 | 2.63±0.1 |
| B | 25 | 87.2 | 1.68 |
| C | 24 | 87.5 | 2.06 |
| D | 47 | 84.7 | 2.36 |
| E | 34 | 87.1 | 2.01 |
| F | 30 | 89.3 | 2.08 |
| G | 38 | 88.6 | 1.70 |
| H | 95 | 85.0 | 2.09 |
| I | 138 | 81.0 | 1.77 |
| J | 102 | 82.8 | 2.10 |
| K | 69 | 82.0 | 2.23 |

If desired, oxygen could be bled into the chamber during the evaporation of the borosilicate glass as a film 8. The $SiO_2$ content of such film 8 increased with the consumption of the borosilicate glass source 26 whereas the $SiO_2$ content decreased with increased $O_2$ partial pressure, the latter being maintained during evaporation of the film 8.

An additional bonus obtained when depositing the dielectric layer 8 by E-gun deposition is the low stress that results in the layer 8. An evaporation rate equivalent to 40–80 Å/sec., as measured at approximately 10 inches from the source, has been found to produce minimal stress levels in the deposited borosilicate film 8. Whereas the $Na_2O$ content of the bulk source material 26 and that of the film 8 are approximately the same, there is a difference in $Al_2O_3$ content between the bulk 26 and deposited layer 8 by about 2.5%, with the layer 8 having the lesser amount. While the stress in film 8 is compressive and about $4\text{--}10 \times 10^8$ dynes/cm$^2$, when the two panels that include substrates 4 and 4', respectively, are sealed at 500° C for 30 minutes, the normal gas panel sealing cycle, the stress of such film 8 is reduced either to zero or below measurable levels. A representative sealing cycle comprises heating the two panels 4 and 4', after the dielectric layers 8 have been deposited on their respective plates, at a rate of 100° C per hour up to 500° C. The fused panels are held at this temperature for 30 minutes, then allowed to cool to room temperature at the rate of 80° C per hour. Although a cooling rate of 80° C per hour has been found to be a very satisfactory upper limit, all lower rates of cooling have also been satisfactory.

Table II gives a summary of data on the compositions of the bulk source material 26 and the film 8, respectively.

TABLE II

| Composition | Bulk | Film |
|---|---|---|
| $SiO_2$ | 83.0 | 82–89 wt.% |
| $B_2O_3$ | 11.0 | 8–15 |
| $Al_2O_3$ | 2.5 | <0.09 |
| $Na_2O$ | 2.2 | 1.7–2.4 |

By using an E-gun deposition process for the laying down of glass insulation 8 over the electrodes 6, relatively thick (5–50μ) stable films 8 can be produced. Additionally, by maintaining a large (2–10 cm$^2$) source of borosilicate glass, larger areas of film can be coated for a given rate of evaporation. The elevated substrate 4 temperatures (~200°–300° C) help to improve the dielectric properties of the glass film 8 so as to achieve a dielectric coating having those exceptionally good electrical and optical properties needed for making a gas discharge display unit. In effect, the E-gun deposition produces a film 8 having high dielectric integrity, which is optically smooth, has high light transmittance, and is relatively quick and inexpensive to make. It should be noted that the total weight % of the bulk source material 26 is slightly less than 100% as shown in Table II. However, the contents of $SiO_2$ and $B_2O_3$ will vary slightly from run to run so that such variation will normally make up the difference from 100%.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Method of fabricating a dielectric glass layer on a substrate comprising the steps of:
    heating a source of borosilicate glass in an evacuated chamber by a scanning electron beam to a uniformly heated molten pool whose surface area is in the range from at least 2cm$^2$ to approximately 10cm$^2$ to provide a stream of evaporated source material at a rate equivalent to 40–80 Å/sec. as measured at approximately 10 inches away from said source,
    shielding said substrate from said stream until the latter has attained a uniform evaporation rate,
    maintaining said substrate at a temperature of 200° C to 300° C during such deposition,
    depositing a layer of borosilicate glass of thickness less than approximately 50 microns on said substrate; and
    annealing said deposited layer at temperature substantially higher than said substrate temperature during said depositing of said borosilicate glass.

2. Method as set forth in claim 1 wherein said dielectric layer is fabricated as part of a gas discharge panel and said substrate has thin film metallurgy on the top surface thereof.

3. Method as set forth in claim 1 wherein said annealing temperature is approximately 500° C.

4. Method as set forth in claim 1 in which said annealing step comprises
    (1) heating the deposited layer of borosilicate glass at approximately 100° C/hr until said layer reaches approximately 500° C.
    (2) maintaining said layer at such 500° C temperature for approximately 30 minutes, and
    (3) cooling said layer from said 500° C temperature to room temperature at the rate of approximately 80° C/hr.

5. Method as set forth in claim 1 wherein said deposited layer of borosilicate glass has thickness approximately 6.5 microns.

6. The method as set forth in claim 1 wherein said chamber is evacuated to a pressure of the order of 10$^{-6}$ torr during the evaporation of said borosilicate glass.

7. The method as set forth in claim 1 wherein said source of borosilicate glass is composed of at least 83% by weight of $SiO_2$, 11% by weight of $B_2O_3$, 2.5% by weight of $Al_2O_3$, and 2.2% by weight of $Na_2O$.

8. Method as set forth in claim 7 wherein said substrate has a thermal coefficient of expansion range of $25-100 \times 10^{-7}$ inches per inch per degree centigrade and the composition of said deposited layer of borosilicate glass consists of and varies as $SiO_2$ (82–89 weight %), $B_2O_3$ (8–15 weight %) and $Na_2O$ (1.7 to 2.4 weight %).

9. The method as set forth in claim 1 including the steps of:

providing a source of MgO within said evacuated chamber during the deposition of said borosilicate glass, providing shielding means for said source of MgO, heating said MgO to its evaporation temperature while in said evacuated chamber, removing said shielding means from said MgO source so as to evaporate said MgO, and depositing a layer of MgO on said deposited layer of borosilicate glass while maintaining said substrate at a temperature of 200° to 300° C during said MgO deposition.

* * * * *